(12) United States Patent
Taki

(10) Patent No.: US 7,041,519 B2
(45) Date of Patent: May 9, 2006

(54) METHOD FOR PRODUCING P-TYPE GROUP III NITRIDE COMPOUND SEMICONDUCTOR

(75) Inventor: Tetsuya Taki, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 23 days.

(21) Appl. No.: 10/665,475

(22) Filed: Sep. 22, 2003

(65) Prior Publication Data

US 2004/0058465 A1   Mar. 25, 2004

(30) Foreign Application Priority Data

Sep. 19, 2002  (JP) ............................. 2002-272554
Jul. 25, 2003   (JP) ............................. 2003-279732

(51) Int. Cl.
*H01L 21/00*     (2006.01)

(52) U.S. Cl. .......................................... 438/22; 438/46

(58) Field of Classification Search .................. 438/46, 438/47, 22, 795
See application file for complete search history.

(56) References Cited

U.S. PATENT DOCUMENTS

| | | | |
|---|---|---|---|
| 5,306,662 A | | 4/1994 | Nakamura et al. |
| 6,020,602 A | * | 2/2000 | Sugawara et al. ......... 257/103 |
| 6,258,614 B1 | * | 7/2001 | Kaneko ....................... 438/22 |
| 6,479,313 B1 | * | 11/2002 | Ye et al. ....................... 438/47 |
| 6,495,433 B1 | * | 12/2002 | Shin ............................. 438/569 |
| 6,537,838 B1 | * | 3/2003 | Stockman ..................... 438/22 |
| 6,562,129 B1 | * | 5/2003 | Hasegawa et al. .......... 117/105 |
| 6,838,705 B1 | * | 1/2005 | Tanizawa ..................... 257/101 |
| 6,911,079 B1 | * | 6/2005 | Rice et al. ...................... 117/2 |
| 2002/0068374 A1 | * | 6/2002 | Sakai ........................... 438/46 |
| 2002/0157596 A1 | * | 10/2002 | Stockman et al. ............. 117/2 |
| 2003/0132442 A1 | * | 7/2003 | Chang et al. ................. 257/79 |

FOREIGN PATENT DOCUMENTS

| | | |
|---|---|---|
| JP | 05-183189 | 7/1993 |
| JP | 05-198841 | 8/1993 |
| JP | 08-097471 | 4/1996 |

OTHER PUBLICATIONS

Nakamura, et al., "Hole Compensation Mechanism of P-Type GaN Films", Jpn. J. App. Phys. vol. 31 Part 1, No. 5A, May 1992, pp. 1258-1266.
Amano, et al., "GaN Blue and UV Light Emitting Diodes with a PN Junction", Oyo Buturi, vol. 60, No. 2, 1991, pp. 163-166.

* cited by examiner

*Primary Examiner*—Tuan H. Nguyen
(74) *Attorney, Agent, or Firm*—McGinn IP Law Group PLLC

(57) ABSTRACT

A second Group III nitride compound semiconductor layer not doped with any impurities or doped with n-type impurities or with n-type and p-type impurities is formed on a first Group III nitride compound semiconductor layer doped with p-type impurities. Resistance is reduced by a heat treatment after or during the formation of the second Group III nitride compound semiconductor layer.

20 Claims, 1 Drawing Sheet

METHOD FOR PRODUCING P-TYPE GROUP III NITRIDE COMPOUND SEMICONDUCTOR

The present application is based on Japanese Patent Applications Nos. 2002-272554 and 2003-279732, which are incorporated herein by reference.

BACKGROUND OF THE INVENTION

1. Field of the Invention

The present invention relates to Group III nitride compound semiconductors used in optical devices such as light-emitting diodes in a range of from an ultraviolet region to a red region, laser diodes, etc., and electronic devices such as high-temperature devices, etc. and particularly to methods for producing low-resistance p-type Group III nitride compound semiconductors.

2. Description of the Related Art

Generally, even in the case where p-type impurities are added to a Group III nitride compound semiconductor produced by an metal organic vapor phase epitaxy method (MOVPE method), it is impossible to obtain low-resistance p-type semiconductor crystal as obtained in a gallium phosphide (GaP) or gallium arsenide (GaAs) semiconductor which is a Group III-Group V compound semiconductor like the Group III nitride compound semiconductor. It is conceived that the cause of this fact is in that, for example, Mg (magnesium) as p-type impurities is bonded to hydrogen contained in raw material gas (such as TMG (trimethyl gallium) or ammonia) and separated at the time of crystal growth to thereby inhibit Mg from being activated to function as an acceptor even in the case where Mg takes the place of the Group III element capable of functioning as an acceptor originally in Group III nitride compound semiconductor crystal (e.g., see Non-Patent Document 1).

Therefore, in order to obtain low-resistance p-type crystal, after addition of p-type impurities, a heat treatment such as electron beam irradiation is applied to the Group III nitride compound semiconductor to thereby obtain resistivity of from 2 Ω·cm to 10 Ω·cm (hole carrier density of from about $1 \times 10^{17}/cm^3$ to about $2 \times 10^{17}/cm^3$). With respect to the reduction in resistivity due to the heat treatment, the thought that hydrogen bonded to Mg as p-type impurities is separated by heat so as to be desorbed from the inside of crystal has been reported (e.g., see Non-Patent Document 2 and Patent Documents 1 and 2).

[Non-Patent Document 1] Jpn. J. Appl. Phys., Vol. 31, pp. 1258–1266, 1992

[Non-Patent Document 2] "OYO BUTURI", Vol. 60, p. 163, 1991

[Patent Document 1] Unexamined Japanese Patent Publication No. Hei-5-183189 (page 6, FIG. 1)

[Patent Document 2] Unexamined Japanese Patent Publication No. Hei-5-198841 (page 5, FIG. 1)

The resistivity of the p-type Group III nitride compound semiconductor is, however, still about one figure higher than that of the GaP or GaAs compound semiconductor. It cannot be said that activation of p-type impurities is achieved sufficiently. On the other hand, as shown in FIG. 12 of Unexamined Japanese Patent Publication No. Hei-8-97471, in the case of the Group III nitride compound semiconductor, as the amount of Mg added as p-type impurities increases, hole carrier density shows a tendency to increase, that is, resistivity shows a tendency to decrease before the amount of Mg reaches a certain value, but hole carrier density shows a tendency to decrease, that is, resistivity shows a tendency to increase after the amount of Mg reaches the certain value. This hole carrier density saturation phenomenon cannot be explained only by the fact that the cause of a barrier to activation of Mg as p-type impurities is bonding of hydrogen contained in the raw material gas and Mg. The present inventor conceives that a part of Mg which is p-type impurities exists as Mg substituted for Ga (gallium) which is a Group III element in the process of crystal growth of the Group III nitride compound semiconductor but the other part of Mg exists as Mg held in interstitial sites of the Group III nitride compound semiconductor, and that Mg held in the interstitial sites compensates for Mg substituted for Ga (self-compensating effect).

SUMMARY OF THE INVENTION

Therefore, an object of the invention is to provide a method for producing low-resistance p-type Group III nitride compound semiconductor equivalent to the GaP or GaAs compound semiconductor by desorbing p-type impurities held in interstitial sites from the inside of crystal efficiently.

A method of producing low-resistance p-type Group III nitride compound semiconductor according to the invention includes the steps of: forming a first Group III nitride compound semiconductor layer doped with p-type impurities; forming a second Group III nitride compound semiconductor layer substantially not doped with any impurities or substantially doped with n-type impurities or substantially doped with n-type and p-type impurities; and reducing resistance after or during the step of forming the second Group III nitride compound semiconductor layer. Incidentally, the reason why the second Group III nitride compound semiconductor layer is doped with n-type impurities or n-type and p-type impurities is as follows. When the second Group III nitride compound semiconductor layer is doped with n-type impurities, p-type impurities existing in interstitial sites of the first Group III nitride compound semiconductor layer are taken in the second Group III nitride compound semiconductor layer, that is, solubility is increased because n-type impurities functioning as a donor having properties opposite to those of p-type impurities functioning as an acceptor added to the first Group III nitride compound semiconductor layer are added to the second Group III nitride compound semiconductor layer. On the other hand, when the second Group III nitride compound semiconductor layer is doped with n-type and p-type impurities, diffusion of p-type impurities existing in interstitial sites of the first Group III nitride compound semiconductor layer into the second Group III nitride compound semiconductor layer is promoted in addition to the effect due to addition of n-type impurities. Hereupon, "substantially" means that there are no other intentional impurities in the second Group III nitride compound semiconductor layer. Thus, "the second Group III nitride compound semiconductor layer substantially not doped with any impurities" means that there are no intentional impurities in the second Group III nitride compound semiconductor layer.

The method according to the invention may further include the step of removing the second Group III nitride compound semiconductor layer after or during the step of reducing resistance. This is because electrodes can be formed on the first Group III nitride compound semiconductor layer subjected to the step of reducing resistance when the second Group III nitride compound semiconductor layer is removed.

Preferably, in the method according to the invention, the second Group III nitride compound semiconductor layer has a thickness selected to be in a range of from 1 nm to 100 nm, both inclusively. If the thickness is smaller than 1 nm, p-type impurities existing in interstitial sites of the first Group III nitride compound semiconductor layer cannot be taken in the second Group III nitride compound semiconductor layer sufficiently. If the thickness is larger than 100 nm, there occur a disadvantage that a drive voltage increases when the semiconductor is applied to a device because the second Group III nitride compound semiconductor layer itself is higher in resistivity (i.e., lower in hole carrier density) than the first Group III nitride compound semiconductor layer, and a disadvantage that ohmic junctions cannot be obtained in consideration of ohmic contact with metal.

Preferably, in the method according to the invention, the amount of p-type impurities added to the second Group III nitride compound semiconductor layer is smaller than the amount of p-type impurities added to the first Group III nitride compound semiconductor layer. This is because the difference between impurity concentrations permits p-type impurities to be moved (diffused) from the first Group III nitride compound semiconductor layer to the second Group III nitride compound semiconductor layer.

As described above, the method of producing low-resistance p-type Group III nitride compound semiconductor according to the invention includes the steps of: forming a first Group III nitride compound semiconductor layer doped with p-type impurities; and forming a second Group III nitride compound semiconductor layer not doped with any impurities or doped with n-type impurities or with n-type and p-type impurities. Accordingly, the difference in p-type impurity concentration is formed between the first Group III nitride compound semiconductor layer and the second Group III nitride compound semiconductor layer, so that p-type impurities existing in interstitial sites of the first Group III nitride compound semiconductor layer are moved to the second Group III nitride compound semiconductor layer by use of such a diffusing phenomenon that p-type impurities are moved from the first Group III nitride compound semiconductor layer high in p-type impurity concentration to the second Group III nitride compound semiconductor layer low in p-type impurity concentration. As a result, p-type impurities are desorbed from the first Group III nitride compound semiconductor layer. The method of producing low-resistance p-type Group III nitride compound semiconductor according to the invention further includes the step of reducing resistance after or during the step of forming the second Group III nitride compound semiconductor layer. Accordingly, the percentage of activated p-type impurities contained in the first Group III nitride compound semiconductor layer can be improved.

DETAILED DECSCRIPTION OF THE PREFERRED EMBODIMENTS (Group III Nitride Compound Semiconductor)

"Group III nitride compound semiconductor" means semiconductor represented by the general formula $Al_XGa_YIn_{1-X-Y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_xGa_{1-x}N$, $Al_xIn_{1-x}N$ and $Ga_xIn_{1-x}N$ (0<x<1 each) Incidentally, at least one part of the Group III element may be replaced by B (boron), Tl (thallium), etc. At least one part of N (nitrogen) may be replaced by P (phosphorus), As (arsenic), Sb (antonomy), Bi (bismuth), etc.

(p-Type Impurities)

"p-type impurities" means Mg (magnesium), Zn (zinc), Be (beryllium), Ca (calcium), Sr (strontium) and Ba (barium) which are Group III elements.

(n-Type Impurities)

"n-type impurities" means Si (silicon), Ge (germanium) and C (carbon) which are Group IV elements, and Se (selenium) and Te (tellurium) which are Group VI elements.

(Resistance Reducing Step)

The resistance reducing step is carried out by a heat treatment. An existing heating method using electron beam irradiation or laser beam irradiation or a method using heating in a furnace such as an oven may be used as the method for performing the heat treatment. Incidentally, the heat treatment may be preferably performed in a vacuum or in an atmosphere containing inert gas such as $N_2$, He or Ar or containing oxygen, that is, the heat treatment maybe preferably performed in an atmosphere free from hydrogen. If hydrogen is contained in the atmosphere, hydrogen bonded to p-type impurities is inhibited from being desorbed from the inside of Group III nitride compound semiconductor crystal. The temperature used for the heat treatment may be preferably kept 350° C. or higher. This is because energy is required for debonding p-type impurities from hydrogen The configuration of the invention will be described below in more detail on the basis of embodiments thereof.

[Embodiment 1]

Figure 1:
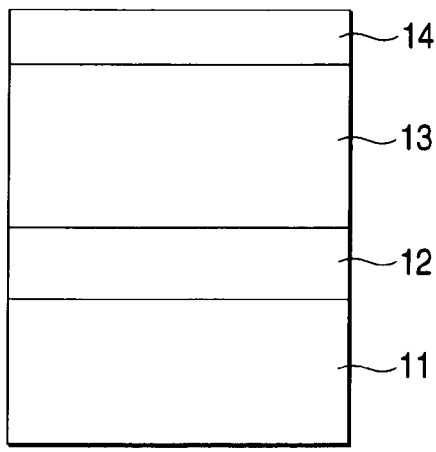
FIG. 1 is a view typically showing the configuration of Embodiment 1 of the invention.

Embodiment 1 shows the case where impurities are not added to the second Group III nitride compound semiconductor layer. FIG. 1 is a view typically showing the configuration of this embodiment. Specifications of respective layers are as follows.

| Layer | Composition (Impurities) |
|---|---|
| Second Group III nitride compound semiconductor layer 14 | $Ga_{0.85}In_{0.15}N$ |
| First Group III nitride compound semiconductor layer 13 | GaN (Mg) |
| Buffer layer 12 | AlN |
| Substrate 11 | sapphire |

First, a sapphire substrate cleaned well was put on a susceptor in an MOVPE apparatus (hereinafter referred to as "reactor"). After the reactor was evaluated to a vacuum, a surface of the sapphire substrate was etched and cleaned at 1050° C. for 20 minutes while a hydrogen gas was made to flow into the reactor. Then, the substrate temperature was decreased to 400° C. and a 30 nm-thick AlN buffer layer was grown on the substrate while a TMA (trimethyl aluminum) gas as an Al source, an ammonia gas as an N source and a hydrogen gas as a carrier gas were made to flow into the reactor.

Then, only the TMA gas was stopped and the temperature was increased to 1000° C. Then, while a TMG (trimethyl gallium) gas as a Ga source and a $Cp_2Mg$ (cyclopentadienyl magnesium) gas as a source of Mg which is p-type impurities were made to flow into the reactor, crystal growth was performed for 20 minutes so that a 200 nm-thick GaN layer doped with Mg was grown as a first Group III nitride compound semiconductor layer. Incidentally, two levels of $1\times10^{19}/cm^3$ and $2\times10^{21}/cm^3$ were selected as the amount of added Mg.

Then, the TMG gas, the $Cp_2Mg$ gas and the hydrogen gas were stopped, a nitrogen gas as a carrier gas was made to flow into the reactor and the temperature was decreased to 800° C. Then, while a TMI (trimethyl indium) gas as an In source and the TMG gas were made to flow into the reactor, crystal growth was performed for 5 minutes so that a 10 nm-thick $Ga_{0.85}In_{0.15}N$ layer was grown as a second Group III nitride compound semiconductor layer.

Then, the TMG gas, the TMI gas and the ammonia gas were stopped. After the temperature was kept at 800° C. for 10 minutes, the temperature was cooled to room temperature. The wafer grown in the aforementioned manner was taken out of the reactor and put in an electron beam irradiation apparatus. The Mg-doped GaN layer as the first Group III nitride compound semiconductor layer and the $Ga_{0.85}In_{0.15}N$ layer as the second Group III nitride compound semiconductor layer were irradiated with electron beams at about 600° C. under the condition of an acceleration voltage of 5 kV and a sample current of 10 μA.

Holes in the Mg-doped GaN layer as the first Group III nitride compound semiconductor layer obtained by electron beam irradiation were measured. As a result, resistivity and hole carrier density were 0.8 Ω·cm and $5\times10^{17}/cm^3$ respectively when the amount of added Mg was $1\times10^{19}/cm^3$, and resistivity and hole carrier density were 0.2 Ω·cm and $1\times10^{18}/cm^3$ respectively when the amount of added Mg was $2\times10^{21}/cm^3$. This shows very excellent characteristic compared with the related art. As the amount of added Mg increases, increase in hole carrier density, that is, reduction in resistance can be achieved. In addition, this also shows that the hole carrier density saturation phenomenon observed in FIG. 12 of JP-A-8-97471 can be eliminated.

[Embodiment 2]

Embodiment 2 shows the case where n-type impurities are added to the second Group III nitride compound semiconductor layer. At the time of growth of the $Ga_{0.85}In_{0.15}N$ layer as the second Group III nitride compound semiconductor layer after the growth of the Mg-doped GaN layer as the first Group III nitride compound semiconductor layer in Embodiment 1, an $SiH_4$ (silane) gas was made to flow along with the TMI gas, the TMG gas, the ammonia gas and the nitrogen gas to thereby add Si as n-type impurities to the $Ga_{0.85}In_{0.15}N$ layer.

Holes in the Mg-doped GaN layer as the first Group III nitride compound semiconductor layer subjected to electron beam irradiation in the same manner as in Embodiment 1 were measured. A result of the measurement was substantially the same as in Embodiment 1 and exhibited very excellent characteristic compared with the related art.

[Embodiment 3]

Embodiment 3 shows the case where n-type and p-type impurities are added to the second Group III nitride compound semiconductor layer. At the time of growth of the $Ga_{0.85}In_{0.15}N$ layer as the second Group III nitride compound semiconductor layer after the growth of the Mg-doped GaN layer as the first Group III nitride compound semiconductor layer in Embodiment 1, an $SiH_4$ (silane) gas and a DEZ (diethyl zinc) gas were made to flow along with the TMI gas, the TMG gas, the ammonia gas and the nitrogen gas to thereby simultaneously add Si as n-type impurities and Zn as p-type impurities to the $Ga_{0.85}In_{0.15}N$ layer.

Holes in the Mg-doped GaN layer as the first Group III nitride compound semiconductor layer subjected to electron beam irradiation in the same manner as in Embodiment 1 were measured. A result of the measurement was substantially the same as in Embodiment 1 and exhibited very excellent p-type characteristic compared with the related art.

[Embodiment 4]

Embodiment 4 shows the case where the second Group III nitride compound semiconductor layer is removed. The $Ga_{0.85}In_{0.15}N$ layer not doped with impurities or doped with Si or with Si and Zn was grown as the second Group III nitride compound semiconductor layer on the Mg-doped GaN layer as the first Group III nitride compound semiconductor layer in the same manner as in Embodiments 1 to 3. Then, the gases except the nitrogen gas were stopped and the temperature was increased to 1000° C. and kept for 10 minutes. In this case, the $Ga_{0.85}In_{0.15}N$ layer as the second Group III nitride compound semiconductor layer was thermally decomposed. At the same time, a heat treatment for reducing resistance of the first Group III nitride compound semiconductor layer was performed in the reactor.

A result of measurement of holes in the Mg-doped GaN layer as the first Group III nitride compound semiconductor layer obtained in this manner was substantially the same as in Embodiment 1 and exhibited very excellent p-type characteristic compared with the related art.

[Embodiment 5]

Embodiment 5 shows the case where the invention is applied to a light-emitting diode. First, a sapphire substrate cleaned well was put on a susceptor in a reactor. After the reactor was evaluated to a vacuum, a surface of the sapphire substrate was etched and cleaned at 1050° C. for 20 minutes while a hydrogen gas was made to flow into the reactor. Then, the substrate temperature was decreased to 400° C. and a 30 nm-thick AlN buffer layer was grown on the substrate while a TMA (trimethyl aluminum) gas as an Al source, an ammonia gas as an N source and a hydrogen gas as a carrier gas were made to flow into the reactor.

Then, the TMA gas was stopped and the temperature was increased to 1000° C. Then, while a TMG gas as a Ga source, the ammonia gas and an $SiH_4$ gas were made to flow into the reactor, crystal growth was performed so that a 4 μm-thick GaN layer doped with Si was grown on the buffer layer.

Then, the TMG gas, a TMI gas and the ammonia gas were used so that a light-emitting layer-containing layer of a quantum well structure constituted by a laminated structure of GaN and $Ga_{0.80}In_{0.20}N$ was grown on the Si-doped GaN layer.

Then, the TMA gas, the TMG gas, a $Cp_2Mg$ gas and the ammonia gas were used so that Mg-doped $Al_{0.15}Ga_{0.85}N$ was grown as the first Group III nitride compound semiconductor at a temperature of 1000° C.

Then, a nitrogen gas as a carrier gas was made to flow into the reactor and the temperature was decreased to 800° C. Then, while the TMI gas, the TMG gas and the ammonia gas were made to flow into the reactor, crystal growth was performed for 5 minutes so that a 10 nm-thick $Ga_{0.85}In_{0.15}N$ layer was grown as the second Group III nitride compound semiconductor layer.

Then, the temperature was increased to 1000° C. By the increase in the temperature, the $Ga_{0.85}In_{0.15}N$ layer as the second Group III nitride compound semiconductor layer was thermally decomposed so as to vanish. At the same time, by the increase in the temperature, the Mg-doped $Al_{0.15}Ga_{0.85}N$ layer as the first Group III nitride compound semiconductor layer was heat-treated to reduce resistance of the $Al_{0.15}Ga_{0.85}N$ layer.

Then, while a hydrogen gas as a carrier gas was made to flow along with the TMG gas, the $Cp_2Mg$ gas and the ammonia gas, Mg-doped GaN was grown as the first Group III nitride compound semiconductor layer at a temperature of 1000° C.

Then, a nitrogen gas as a carrier gas was made to flow into the reactor and the temperature was decreased to 800° C. Then, while the TMI gas, the TMG gas and the ammonia gas were made to flow into the reactor, crystal growth was performed for 5 minutes so that a 10 nm-thick $Ga_{0.85}In_{0.15}N$ layer was grown as the second Group III nitride compound semiconductor layer.

Then, the TMG gas, the TMI gas and the ammonia gas were stopped. The temperature was kept at 800° C. for 10 minutes and then cooled to room temperature. The wafer grown in this manner was taken out of the reactor and put in an electron beam irradiation apparatus. The Mg-doped GaN layer as the first Group III nitride compound semiconductor layer and the $Ga_{0.85}In_{0.15}N$ layer as the second Group III nitride compound semiconductor layer were irradiated with electron beams at about 600° C. under the condition of an acceleration voltage of 5 kV and a sample current of 10 μA.

Then, a part of the wafer was etched to reveal the Si-doped GaN layer. Ohmic electrodes were formed on the Si-doped GaN layer and the $Ga_{0.85}In_{0.15}N$ layer as the second Group III nitride compound semiconductor layer respectively. Then, the wafer was cut into chips by a dicing saw. Then, each chip was mounted on a lead frame, wire-bonded and sealed with a resin to thereby produce a lamp. When a current was applied, light emission that had been observed just under the electrodes in the related art was observed as spread light emission. In addition, the forward voltage was 3.2 V at 20 mA and improved by about 5% compared with the related art.

[Embodiment 6]

Embodiment 6 shows the case where the invention is applied to a light-emitting diode like Embodiment 5. First, a sapphire substrate 61 cleaned well was put on a susceptor in a reactor. After the reactor was evaluated to a vacuum, a surface of the sapphire substrate 61 was etched and cleaned at 1050° C. for 20 minutes while a hydrogen gas was made to flow into the reactor. Then, the substrate temperature was decreased to 400° C. and a 30 nm-thick AlN buffer layer 62 was grown on the substrate while a TMA gas as an Al source, an ammonia gas as an N source and a hydrogen gas as a carrier gas were made to flow into the reactor.

Then, the TMA gas was stopped and the temperature was increased to 1000° C. Then, while a TMG gas as a Ga source, the ammonia gas and an $SiH_4$ gas were made to flow into the reactor, crystal growth was performed so that a 4 μm-thick Si-doped GaN layer 63 was grown on the buffer layer 62.

Then, the TMG gas, a TMI gas and the ammonia gas were used so that a light-emitting layer-containing layer 64 of a quantum well structure constituted by a laminated structure of GaN and $Ga_{0.80}In_{0.20}N$ was grown on the Si-doped GaN layer 63.

Then, the TMA gas, the TMG gas, a $Cp_2Mg$ gas and the ammonia gas were used so that an Mg-doped $Al_{0.15}Ga_{0.85}N$ layer 65 was grown on the light-emitting layer-containing layer 64 at a temperature of 1000° C.

Then, the TMG gas, the $Cp_2Mg$ gas and the ammonia gas were used so that an Mg-doped GaN layer 66 was grown on the Mg-doped $Al_{0.15}Ga_{0.85}N$ layer 65 at a temperature of 1000° C.

Then, a nitrogen gas as a carrier gas was made to flow into the reactor and the temperature was decreased to 800° C. Then, while the TMI gas, the TMG gas, the $Cp_2Mg$ gas, the $SiH_4$ gas and the ammonia gas were made to flow into the reactor, crystal growth was performed for 5 minutes so that a 1.5 nm-thick $Ga_{0.80}In_{0.20}N$ layer 67 doped with Si and Mg was grown on the Mg-doped GaN layer 66.

Then, the TMG gas, the TMI gas and the ammonia gas were stopped. The temperature was kept at 800° C. for 10 minutes and then cooled to room temperature. The wafer grown in this manner was taken out of the reactor and put in an electron beam irradiation apparatus. The Mg-doped $Al_{0.15}Ga_{0.85}N$ layer 65, the Mg-doped GaN layer 66 and the Si, Mg-doped $Ga_{0.80}In_{0.20}N$ layer 67 were irradiated with electron beams at a temperature of about 600° C. under the condition of an acceleration voltage of 5 kV and a sample current of 10 μA. Incidentally, in this embodiment, the Mg-doped $Al_{0.15}Ga_{0.85}N$ layer 65 and the Mg-doped GaN layer 66 correspond to the first Group III nitride compound semiconductor layer whereas the Si, Mg-doped $Ga_{0.80}In_{0.20}N$ layer 67 corresponds to the second Group III nitride compound semiconductor layer.

Figure 2:
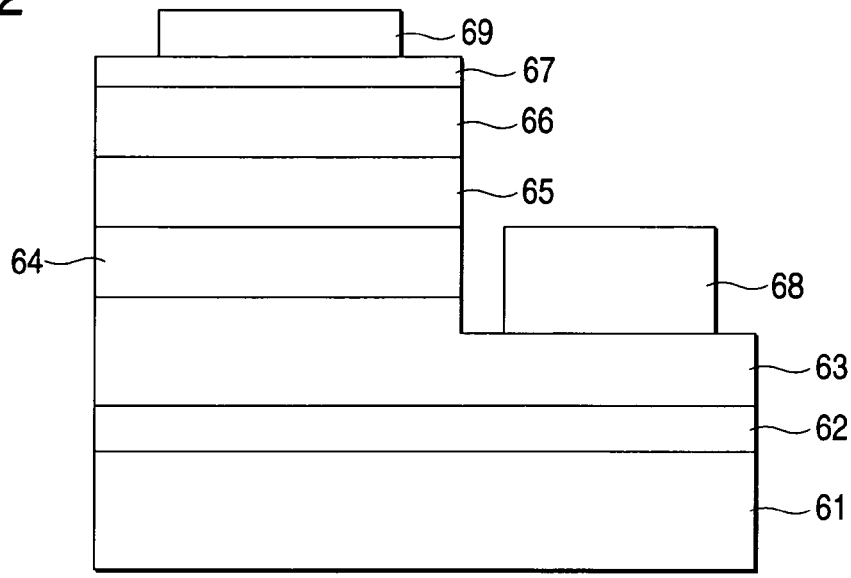
FIG. 2 is a view typically showing the configuration of Embodiment 6 of the invention.
Figure 3:
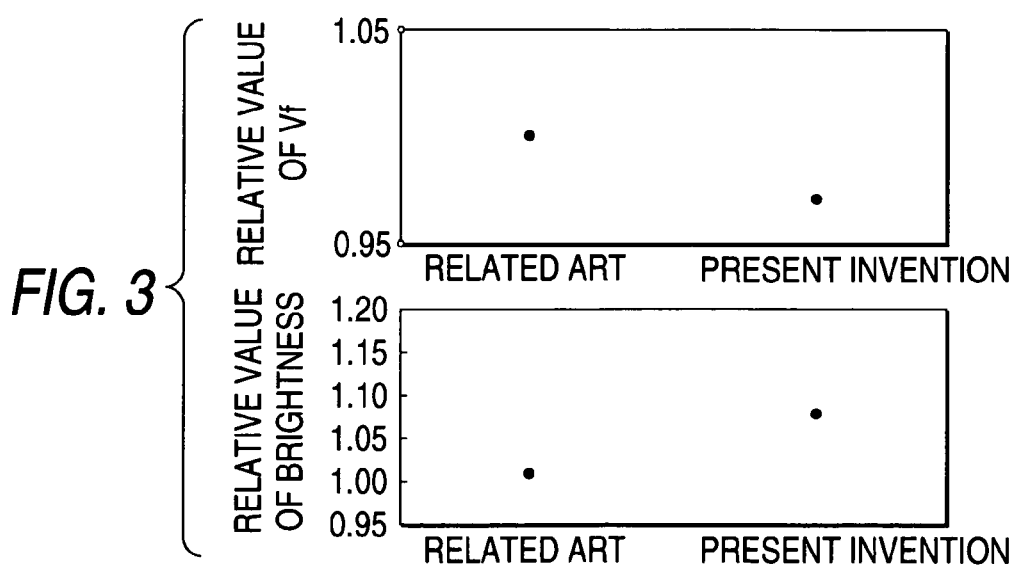
FIG. 3 is a graph for comparing the effect of Embodiment 6 of the invention with the related art.

Then, apart of the wafer was etched to reveal the Si-doped GaN layer 63. Ohmic electrodes 68 and 69 were formed on the Si-doped GaN layer 63 and the Si, Mg-doped $Ga_{0.80}In_{0.20}N$ layer 67 respectively. Then, the wafer was cut into chips by a dicing saw. FIG. 2 shows the sectional structure of each chip. Then, each chip was mounted on a lead frame, wire-bonded and sealed with a resin to thereby produce a lamp. FIG. 3 is a graph showing forward voltage (Vf) and emitted light intensity (brightness) at a forward current of 20 mA in comparison between the case where the Si, Mg-doped $Ga_{0.80}In_{0.20}N$ layer 67 is not provided (related art) and the case where the Si, Mg-doped $Ga_{0.80}In_{0.20}N$ layer 67 is provided (this invention). Incidentally, numerical values on the vertical axes are relative values on the assumption that values in the related art are regarded as "1". It is obvious that both Vf and brightness are improved by about 5% according to this invention.

Although the embodiments have shown the case where sapphire ($Al_2O_3$) is used as the substrate, the invention is not limited thereto. For example, spinel ($MgAl_2O_4$), silicon (Si), silicon carbide (SiC), zinc oxide (ZnO), gallium phosphide (GaP), gallium arsenide (GaAs), magnesium oxide (MgO), manganese oxide ($MnO_2$), YSZ (yttria-stabilized zirconia), $ZrB_2$ (zirconium diboride), etc. may be used as the substrate. It is a matter of course that Group III nitride compound semiconductor single crystal or the like may be also used as the substrate. Although the embodiments have shown the case where AlN is used as the buffer layer, the invention may be also applied to the case where another Group III nitride compound semiconductor such as GaN, InN, AlGaN, GaInN, AlGaInN, etc. than AlN is used as the buffer layer or the case where metal nitride such as titanium nitride ($TiN_x$) is used as the buffer layer. Incidentally, when Group III nitride compound semiconductor is used as the substrate, the buffer layer can be dispensed with. Although the embodiments have shown the case where the buffer layer is formed by an MOVPE method, the invention is not limited thereto. For example, GaN, InN, AlGaN, GaInN, AlGaInN, etc. may be used as the material of the buffer layer, and a molecular beam epitaxy method (MBE method), a halide vapor phase epitaxy method (HVPE method), a sputtering method, anion-plating method, an electron showering method, etc. may be used as the method for producing the buffer layer. As occasion demands, the substrate and the buffer layer may be removed after the semiconductor device is formed.

Although the embodiments have shown the case where a GaN layer, an AlGaN layer and a GaInN layer are used as the Si, Mg-doped layer, the first Group III nitride compound semiconductor layer and the second Group III nitride compound semiconductor layer, the invention may be also applied to the case where other compounds such as AlN, AlGaInN, etc. are used. Incidentally, the second Group III nitride compound semiconductor layer is preferably made of a compound containing In. This is because Group III nitride compound semiconductor containing In has such a weak bond of InN that In can be diffused into the first Group III nitride compound semiconductor layer easily. For this reason, p-type impurities contained in the first Group III nitride compound semiconductor layer can be diffused into the second Group III nitride compound semiconductor layer more easily. As a result, p-type impurities diffused from the first Group III nitride compound semiconductor layer take the place of In in the second Group III nitride compound semiconductor layer and function as an acceptor.

Each of the Si-doped layer and the p-type impurity-doped layer is not limited to a single layer but may be composed of a plurality of layers different in impurity concentration and band gap energy. Or a superlattice structure may be used.

Although the embodiments have shown the case where a quantum well structure is used as the light-emitting layer-containing layer, the invention may be also applied to the case where a single hetero structure, a double hetero structure or a homo-junction structure is used as the structure of the light-emitting diode.

Although the embodiments have shown the case where the step of removing the second Group III nitride compound semiconductor layer is carried out by thermal decomposition due to heating, the invention may be also applied to the case where the step is carried out by etching or polishing. A dry etching method using plasma or the like or a wet etching method using an acid or alkaline solution can be used for the etching. Incidentally, the $Ga_{0.85}In_{0.15}N$ layer as the second Group III nitride compound semiconductor layer formed on the Mg-doped $Al_{0.15}Ga_{0.85}N$ layer as the first Group III nitride compound semiconductor layer in Embodiment 4 may be removed by etching or polishing as follows. After the $Ga_{0.85}In_{0.15}N$ layer is formed as the second Group III nitride compound semiconductor layer, the temperature is decreased to room temperature. The wafer is taken out of the reactor and treated by an etching apparatus or a polishing apparatus. Then, the wafer is put in the reactor again and heated. Then, crystal growth of the Mg-doped GaN layer as the first Group III nitride compound semiconductor layer is performed.

Although the embodiments have shown the case where a light-emitting diode is produced as the device, the invention may be applied to various kinds of semiconductor devices using Group III nitride compound semiconductor as described above. The devices include: optical devices such as a light-emitting diode, a photo acceptance diode, a laser diode, a solar cell, etc.; bipolar devices such as a rectifier, a thyristor, a transistor, etc.; unipolar devices such as an FET, etc.; and electronic devices such as a microwave device, etc.

The invention is not limited to the description of mode for carrying out the invention and the description of embodiments at all. Various modifications that can be easily conceived by those skilled in the art may be included in the invention without departing from the scope of claim for a patent.

What is claimed is:

1. A method of producing p-type Group III nitride compound semiconductor, comprising:
   forming a first Group III nitride compound semiconductor layer doped with p-type impurities;
   forming a second Group III nitride compound semiconductor layer which is at least one of substantially undoped, doped with n-type impurities, and doped with n-type and p-type impurities, such that an amount of impurities in said second Group III nitride compound semiconductor layer is less than an amount of impurities in said first Group III nitride compound semiconductor layer; and
   reducing a resistance one of after and during said forming said second Group III nitride compound semiconductor layer.

2. A method of producing p-type Group III nitride compound semiconductor according to claim 1, further comprising:
   removing said second Group III nitride compound semiconductor layer one of after and during said reducing said resistance.

3. A method of producing p-type Group III nitride compound semiconductor according to claim 1, wherein said second Group III nitride compound semiconductor layer has a thickness selected to be in a range of from 1 nm to 100 nm, both inclusively.

4. A method of producing p-type Group III nitride compound semiconductor according to claim 1, wherein said second Group III nitride compound semiconductor layer comprises a thickness which is not less than 1 nm.

5. A method of producing p-type Group III nitride compound semiconductor according to claim 1, wherein said reducing said resistance comprises promoting a diffusion of said p-type impurities in said first Group III nitride compound semiconductor layer to diffuse from interstitial sites in said first Group III nitride compound semiconductor layer.

6. A method of producing p-type Group III nitride compound semiconductor according to claim 1, wherein said reducing said resistance comprises promoting a diffusion of said p-type impurities to diffuse from interstitial sites in said first Group III nitride compound semiconductor layer to said second Group III nitride compound semiconductor layer.

7. A method of producing p-type Group III nitride compound semiconductor according to claim 1, said reducing said resistance comprises desorbing said p-type impurities from said first Group III nitride compound semiconductor layer.

8. A method of producing p-type Group III nitride compound semiconductor according to claim 1, wherein said p-type impurities comprise at least one of magnesium, zinc, beryllium, calcium, strontium and barium.

9. A method of producing p-type Group III nitride compound semiconductor according to claim 1, wherein said n-type impurities comprise at least one of silicon, germanium, carbon, selenium and tellurium.

10. A method of producing p-type Group III nitride compound semiconductor according to claim 1, wherein said reducing said resistance comprises performing a heat treatment using one of electron beam irradiation, laser beam irradiation and oven heating.

11. A method of producing p-type Group III nitride compound semiconductor according to claim 10, wherein said heat treatment is performed in one of a vacuum and a hydrogen-free atmosphere.

12. A method of producing p-type Group III nitride compound semiconductor according to claim 11, wherein said heat treatment comprises heat treating at a temperature of at least 350° C.

13. A method of producing p-type Group III nitride compound semiconductor according to claim 1, wherein said forming said first and second Group III nitride compound semiconductor layers comprises sequentially depositing said first and second Group III nitride compound semiconductor layers in a reaction chamber.

14. A method of producing p-type Group III nitride compound semiconductor according to claim 13, wherein said forming said second Group III nitride compound semiconductor layer comprises introducing an n-type impurity source gas to said reaction chamber.

15. A method of producing p-type Group III nitride compound semiconductor according to claim 13, wherein said forming said second Group III nitride compound semiconductor layer comprises introducing an n-type impurity source gas and a p-type impurity source gas to said reaction chamber.

16. A method of producing p-type Group III nitride compound semiconductor according to claim 13, further comprising:
removing said first and second Group III nitride compound semiconductor layers from said reaction chamber, and subjecting said first and second Group III nitride compound semiconductor layers to a heat treatment of greater than 350° C.

17. A method of producing p-type Group III nitride compound semiconductor according to claim 13, further comprising:
subjecting said first and second Group III nitride compound semiconductor layers to a heat treatment of greater than 350° C. without removing said first and second Group III nitride compound semiconductor layers from said reaction chamber.

18. A method of producing p-type Group III nitride compound semiconductor according to claim 17, wherein said subjecting said first and second Group III nitride compound semiconductor layers to a heat treatment comprises thermally decomposing said second Group III nitride compound semiconductor layer.

19. A method of producing p-type Group III nitride compound semiconductor according to claim 1, wherein a thickness of said second Group III nitride compound semiconductor layer is no greater than 100 nm.

20. A method of forming a light-emitting diode, comprising:
forming a first Group III nitride compound semiconductor layer doped with p-type impurities;
forming a second Group III nitride compound semiconductor layer on said first Group III nitride compound semiconductor layer such that an amount of impurities in said second Group III nitride compound semiconductor layer is less tan an amount of impurities in said first Group III nitride compound semiconductor layer; and
after a beginning of said forming said second Group III nitride compound semiconductor layer, performing a heat treatment to reduce an electrical resistivity of said first Group III nitride compound semiconductor layer,
wherein said second Group III nitride compound semiconductor layer is at least one of substantially undoped, doped with n-type impurities, and doped with n-type and p-type impurities.

* * * * *